United States Patent
Ikeda et al.

(10) Patent No.: US 6,639,444 B2
(45) Date of Patent: Oct. 28, 2003

(54) PROTECTION CIRCUIT

(75) Inventors: Keizou Ikeda, Nagoya (JP); Kouichi Takagi, Nagoya (JP); Shuji Mayama, Nagoya (JP)

(73) Assignees: Autonetworks Technologies, Ltd., Aichi (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/202,835

(22) Filed: Jul. 26, 2002

(65) Prior Publication Data

US 2003/0025546 A1 Feb. 6, 2003

(30) Foreign Application Priority Data

Jul. 26, 2001 (JP) ........................................ 2001-226081

(51) Int. Cl.[7] .............................. H03K 5/08; H03K 5/00
(52) U.S. Cl. ....................................... 327/325; 327/326
(58) Field of Search ........................... 361/87, 42, 91.1, 361/115, 91.5; 323/222, 229, 230, 231; 327/326, 325, 324, 309, 330, 331

(56) References Cited

U.S. PATENT DOCUMENTS

| 4,455,585 | A | * | 6/1984 | Murari et al. | ............... 361/18 |
|---|---|---|---|---|---|
| 4,705,322 | A | * | 11/1987 | Yiannoulos | ................ 361/91.6 |
| 4,916,378 | A | * | 4/1990 | Marchio' et al. | ........... 323/222 |
| 5,010,439 | A | * | 4/1991 | Zisa et al. | ................. 361/91.6 |
| 5,894,395 | A | * | 4/1999 | Baurand et al. | .............. 361/87 |
| 6,031,702 | A | * | 2/2000 | Williams | ..................... 361/87 |

FOREIGN PATENT DOCUMENTS

| EP | 352238 | * | 1/1990 |
|---|---|---|---|
| JP | 57-71109 | * | 5/1982 |
| JP | 10-136564 | * | 5/1988 |
| JP | 1-261919 | * | 10/1989 |
| JP | 6-61824 | * | 3/1994 |

* cited by examiner

*Primary Examiner*—Tuan T. Lam
(74) *Attorney, Agent, or Firm*—Oliff & Berridge, PLC

(57) ABSTRACT

A protection circuit 10 has a diode 31 being connected in parallel to an inductive load 11 and having a forward direction set reverse to the conduction direction of a power supply current and a Zener diode 33 being placed between one terminal of the diode 31 and one terminal of the load 11 corresponding to the terminal of the diode and having a forward direction matched with the conduction direction of the power supply current.

2 Claims, 1 Drawing Sheet

PROTECTION CIRCUIT

BACKGROUND OF THE INVENTION

This invention relates to a protection circuit for protecting a transistor, etc., for controlling the conduction state of an electric current to an inductive load and in particular to a protection circuit applied to power supply control in various vehicle-installed power supply distribution sections.

FIG. 2 is a circuit diagram of a protection circuit in a related art and a circuit configuration incorporating the protection circuit. In this kind of protection circuit, a diode 3 is connected in parallel with an inductive load (for example, a motor) 1 as a measure against surge voltage occurring when the load 1 is powered off, as shown in FIG. 2. In the figure, numeral 5 denotes a MOSFET (transistor) for controlling the energization state of the load 1 and numeral 7 denotes a drive circuit for driving the MOSFET 5. Power supply current supplied from a power supply line 9 is supplied via the MOSFET 5 to the load 1.

However, in the protection circuit in the related art, if the circuit configuration shown in FIG. 2 is connected to the power supply line 9 in incorrect polarity by mistake, the power supply current from the power supply line 9 (reverse current) flows into the MOSFET 5 via the diode 3 rather than via the load 1 as on a route A shown in FIG. 2 and there is a fear of breaking the MOSFET 5.

SUMMARY OF THE INVENTION

It is therefore an object of the invention to provide a protection circuit capable of preventing an overcurrent from flowing into a transistor if a circuit configuration incorporating the invention is connected to a power supply in incorrect polarity by mistake while taking a measure against surge voltage occurring when a load in the circuit configuration is powered off.

To the end, according to the invention, there is provided a protection circuit being provided for a circuit configuration comprising an inductive load and a transistor for controlling the energization state of the load, the protection circuit comprising a diode being connected in parallel to the load and having a forward direction set reverse to the conduction direction of a power supply current to the load; and a Zener diode being placed in a conducting path between one terminal of the diode and one terminal of the load corresponding to the terminal of the diode and having a forward direction matched with the conduction direction of the power supply current.

Preferably, the transistor may be placed upstream in the conduction direction of the power supply current relative to the load.

DETAILED DESCRIPTION OF THE PREFERRED EMBODIMENTS

Figure 1:
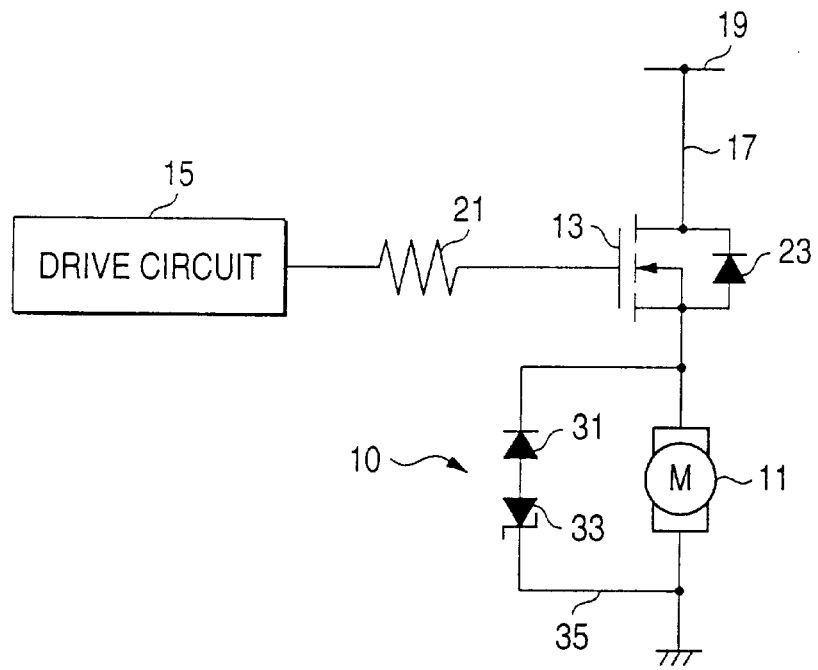
FIG. 1 is a circuit diagram of a protection circuit according to one embodiment of the invention and a circuit configuration incorporating the protection circuit.
Figure 2:
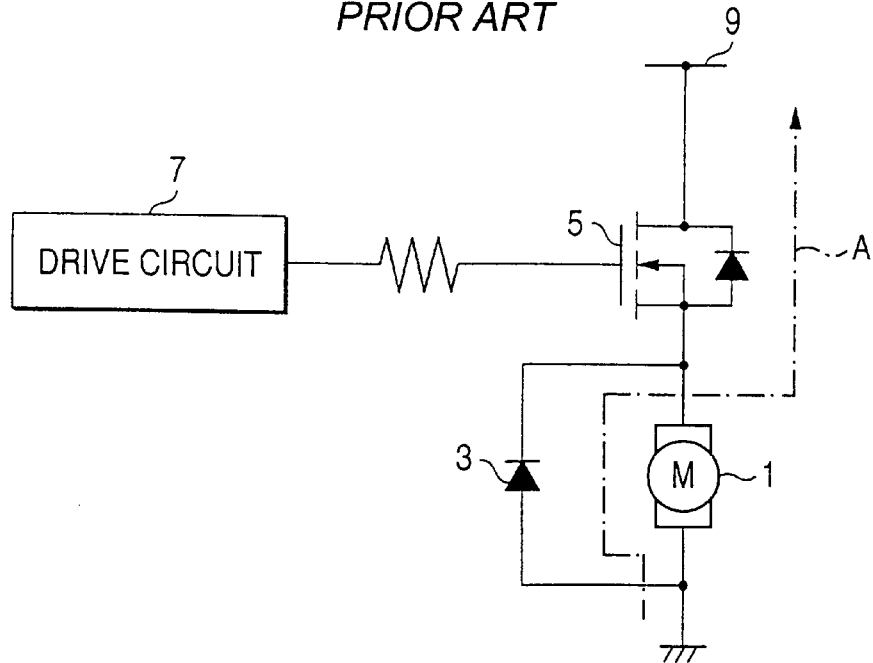
FIG. 2 is a circuit diagram of a protection circuit in a related art and a circuit configuration incorporating the protection circuit.

FIG. 1 is a circuit diagram of a protection circuit according to one embodiment of the invention and a circuit configuration incorporating the protection circuit. The circuit configuration incorporating the protection circuit 10 comprises an inductive load (for example, a motor) 11, an n-channel MOSFET (transistor) 13 for controlling the energization state of the load 11, and a drive circuit 15 for driving the MOSFET 13. The load 11 and the MOSFET 13 are placed in series to an energization path 17 so that the MOSFET 13 is placed upstream in the conduction direction of a power supply current. The energization path 17 is placed between a power supply line 19 and a ground. A resistor 21 is placed between the drive circuit 15 and a gate of the MOSFET 13. A diode 23 is connected to the energization path 17 so as to become parallel with the MOSFET 13. The diode 23 is connected so that the forward direction of the diode 23 becomes reverse to the conduction direction of the power supply current supplied from the power supply line 19 to the energization path 17.

The protection circuit 10 according to the embodiment comprises a diode 31 and a Zener diode 33. The diode 31 and the Zener diode 33 are placed in series to a conducting path 35 connected to the energization path 17 so as to become parallel with the load 11. The diode 31 is connected so that the forward direction of the diode 31 becomes reverse to the conduction direction of the power supply current. The Zener diode 33 is connected so that the forward direction of the Zener diode 33 matches the conduction direction of the power supply current. The inverse breakdown voltage of the Zener diode 33 is set to a higher value than the voltage applied via the power supply line 19 by a predetermined level.

According to the configuration of the protection circuit 10, when the circuit configuration (energization path 17) is connected to the power supply line 19 in the proper direction as shown in FIG. 1, if surge voltage exceeding the inverse breakdown voltage of the Zener diode 33 is generated by the load 11 when the load 11 is powered off, a conduction state is entered between the terminals of the load 11 through the Zener diode 33 and the diode 31 and the surge voltage can be prevented from flowing into the MOSFET 13.

If the circuit configuration is connected to the power supply line 19 in incorrect polarity by mistake, the Zener diode 33 can keep the reverse power supply current from the power supply line 19 from flowing into the MOSFET 13 through the diode 31 and can prevent an overcurrent from flowing into the MOSFET 13.

According to the invention as in aspects 1 and 2, if the circuit configuration incorporating the invention is connected to the power supply in the proper direction, a measure against surge voltage occurring when the load is powered off is taken and the circuit configuration is connected to the power supply in incorrect polarity by mistake, the reverse power supply current can be kept from flowing into the transistor through the diode connected in parallel to the load and an overcurrent can be prevented from flowing into the transistor.

What is claimed is:

1. A protection circuit provided for a circuit configuration including an inductive load and an FET type transistor for controlling in the energization state of said load, said protection circuit comprising:
a diode being connected in parallel to said load, and having a forward direction set reverse to a conduction direction of a power supply current to said load; and
a Zener diode having a breakdown voltage greater than a power supply voltage being placed in a conducting path between one terminal of said diode and one terminal of said load corresponding to said terminal of said diode, and having a forward direction matched with the conduction direction of the power supply current.

2. The protection circuit as claimed in claim 1, wherein said transistor is placed upstream in the conduction direction of the power supply current relative to said load.

* * * * *